(12) United States Patent
Chen et al.

(10) Patent No.: US 10,388,541 B2
(45) Date of Patent: Aug. 20, 2019

(54) WAFER COATING SYSTEM AND METHOD OF MANUFACTURING CHIP PACKAGE

(71) Applicant: XINTEC INC., Taoyuan (TW)

(72) Inventors: Yu-Tung Chen, Taoyuan (TW);
Quan-Qun Su, New Taipei (TW);
Chuan-Jin Shiu, Taoyuan (TW);
Chien-Hui Chen, Taoyuan (TW);
Hsiao-Lan Yeh, Tainan (TW);
Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 517 days.

(21) Appl. No.: 15/098,278

(22) Filed: Apr. 13, 2016

(65) Prior Publication Data

US 2016/0307779 A1   Oct. 20, 2016

Related U.S. Application Data

(60) Provisional application No. 62/150,255, filed on Apr. 20, 2015.

(51) Int. Cl.
| | |
|---|---|
| *H01L 21/56* | (2006.01) |
| *H01L 21/687* | (2006.01) |
| *H01L 21/67* | (2006.01) |
| *H01L 23/31* | (2006.01) |
| *H01L 21/768* | (2006.01) |

(Continued)

(52) U.S. Cl.
CPC ...... *H01L 21/561* (2013.01); *H01L 21/02118* (2013.01); *H01L 21/02282* (2013.01); *H01L 21/6715* (2013.01); *H01L 21/68742* (2013.01); *H01L 21/68764* (2013.01); *H01L 21/76831* (2013.01); *H01L 23/3192* (2013.01); *H01L 21/76898* (2013.01); *H01L 24/03* (2013.01); *H01L 24/11* (2013.01); *H01L 24/94* (2013.01); *H01L 2224/02313* (2013.01); *H01L 2224/0346* (2013.01); *H01L 2224/0391* (2013.01); *H01L 2224/0401* (2013.01); *H01L 2224/05022* (2013.01); *H01L 2224/05548* (2013.01); *H01L 2224/05573* (2013.01); *H01L 2224/05624* (2013.01); *H01L 2224/05647* (2013.01); *H01L 2224/05655* (2013.01);

(Continued)

(58) Field of Classification Search
CPC .................................................. H01L 21/56
See application file for complete search history.

(56) References Cited

U.S. PATENT DOCUMENTS

| | | | |
|---|---|---|---|
| 2003/0052414 A1 | 3/2003 | Cowens et al. | |
| 2011/0217473 A1* | 9/2011 | Kishita | B05D 1/02 427/420 |

FOREIGN PATENT DOCUMENTS

| | | |
|---|---|---|
| CN | 101699622 | 4/2010 |
| CN | 103633038 | 3/2014 |

(Continued)

*Primary Examiner* — Marvin Payen
(74) *Attorney, Agent, or Firm* — Liu & Liu

(57) ABSTRACT

A wafer coating system includes a wafer chuck, a flowing insulating material sprayer and a wafer tilting lifting pin. The wafer chuck has a carrier part and a rotating part, which the carrier part is mounted on the rotating part to carry a wafer, and the rotating part is configured to rotate with a predetermined axis. The flowing insulating material sprayer is above the wafer chuck and configured to spray a flowing insulating material to the wafer, and the wafer tilting lifting pin is configured to form a first acute angle between the wafer and direction of gravity.

14 Claims, 15 Drawing Sheets

(51) Int. Cl.
*H01L 21/02* (2006.01)
*H01L 23/00* (2006.01)

(52) U.S. Cl.
CPC .................. *H01L 2224/131* (2013.01); *H01L 2224/13022* (2013.01); *H01L 2224/13024* (2013.01); *H01L 2224/94* (2013.01)

(56) References Cited

FOREIGN PATENT DOCUMENTS

| | | |
|---|---|---|
| CN | 103703048 | 4/2014 |
| TW | 200816333 | 4/2008 |
| TW | 200947591 | 11/2009 |
| TW | 201301494 | 1/2013 |
| TW | 201347858 | 12/2013 |
| TW | 201511318 | 3/2015 |
| WO | 2008059808 | 5/2008 |

\* cited by examiner

WAFER COATING SYSTEM AND METHOD OF MANUFACTURING CHIP PACKAGE

RELATED APPLICATIONS

This application claims priority to U.S. provisional Application Ser. No. 62/150,255, filed Apr. 20, 2015, which is herein incorporated by reference.

BACKGROUND

Field of Invention

The present invention relates to a wafer coating system and a method of manufacturing a chip package using the wafer coating system.

Description of Related Art

Along with the trends of electronic devices toward lighter and more compact, the semiconductor chip corresponding to the electronic device has a reduced size and increased wiring density. Therefore, it is more difficult and challenging to fabricate a semiconductor chip package in the subsequent process for the semiconductor chip. Wafer-level chip package is a method of packaging the semiconductor chip, which the method means all the chips are packaged and tested after completion of manufacturing these chips on the wafer, and then the wafer is cut into single chip packages.

Since the size of the semiconductor chip is decreased and the functional density on the semiconductor chip is increased, the insulating property of the wafer is one of the important research directions in the chip packaging techniques to avoid erroneous electrical connection. Generally, an oxide is used to prepare an isolation layer of the chip, but the oxide is expensive, and the process of depositing the oxide is complicated and time-consuming, and thus decreases efficiency of the process. Therefore, the oxide is gradually replaced by an epoxy material to prepare the isolation layer of the chip package.

However, the epoxy material is easily affected by the gravity to aggregate, which is not benefit for forming uniform isolation layer, and thus decreases the yield of the chip package.

SUMMARY

Thus, the present disclosure provides a wafer coating system and a method of manufacturing a chip package using the wafer coating system, so as to form a uniform isolation layer.

The present disclosure provides a wafer coating system, which includes a wafer chuck, a flowing insulating material sprayer and a wafer tilting lifting pin. The wafer chuck has a carrier part and a rotating part, which the carrier part is mounted on the rotating part to carry a wafer, and the rotating part is configured to rotate with a predetermined axis. The flowing insulating material sprayer is above the wafer chuck and configured to spray a flowing insulating material to the wafer, and the wafer tilting lifting pin is configured to form a first acute angle between the wafer and direction of gravity.

In various embodiments of the present disclosure, the wafer tilting lifting pin is disposed below the wafer chuck.

In various embodiments of the present disclosure, the wafer tilting lifting pin is disposed between the carrier part and the rotating part.

In various embodiments of the present disclosure, the wafer tilting lifting pin is configured to control the first acute angle in a range from 45 degrees to 89 degrees.

In various embodiments of the present disclosure, the wafer coating system further includes a heater connected to the carrier part to heat the wafer.

In various embodiments of the present disclosure, the flowing insulating material is a photosensitive epoxy.

Another aspect of the present disclosure provides a wafer coating system, which includes a wafer chuck and a flowing insulating material sprayer. The wafer chuck has a carrier part and a rotating part, which the carrier part is mounted on the rotating part to carry a wafer, and the rotating part is configured to rotate with a predetermined axis. The flowing insulating material sprayer is above the wafer chuck, and the flowing insulating material sprayer includes a nozzle and a nozzle moving unit. The nozzle is configured to spray a flowing insulating material to the wafer, and the nozzle moving unit is connected to the nozzle to move the nozzle back and forth in an axial direction above the wafer.

In various embodiments of the present disclosure, the wafer coating system further includes a connecting rod connecting the carrier part and the nozzle moving unit.

In various embodiments of the present disclosure, the wafer coating system further includes a wafer tilting lifting pin configured to form a first acute angle between the wafer and direction of gravity.

In various embodiments of the present disclosure, the wafer coating system further includes a nozzle moving unit tilting lifting pin disposed between the carrier part and the nozzle moving unit to form a second acute angle between the nozzle moving unit and direction of gravity.

Another aspect of the present disclosure provides a method of fabricating a chip package, and the method includes following steps. A wafer is received, which has a conductive pad, a first surface and a second surface opposite to the first surface. A through hole is formed extending in a direction from the second surface to the first surface to expose the conductive pad, and the wafer is tilted to form a first acute angle between the wafer and direction of gravity. The wafer is rotated, and a flowing insulating material is sprayed to the second surface and the through hole of the wafer. Then, the flowing insulating material is cured.

In various embodiments of the present disclosure, the method further includes following steps. A portion of the flowing insulating material in the through hole is removed to expose the conductive pad, and a conductive layer is formed on the second surface and in the through hole. A protective layer is formed to cover the conductive layer, and the protective layer is patterned to form an opening to expose the conductive layer. An external conductive connection is formed in the opening.

In various embodiments of the present disclosure, the method further includes dicing the wafer along a scribe line to form the chip package.

In various embodiments of the present disclosure, the flowing insulating material is cured at a temperature between 35° C. and 45° C.

In various embodiments of the present disclosure, the first acute angle is from 45 degrees to 89 degrees.

In various embodiments of the present disclosure, the first acute angle is from 70 degrees to 89 degrees.

In various embodiments of the present disclosure, the first acute angle is from 85 degrees to 89 degrees.

In various embodiments of the present disclosure, tilting the wafer make the flowing insulating material flow from a bottom to a sidewall of the through hole.

In various embodiments of the present disclosure, the flowing insulating material is a photosensitive epoxy.

In various embodiments of the present disclosure, the method further includes placing the wafer horizontally.

Another aspect of the present disclosure provides a method of fabricating a chip package, and the method includes following steps. A wafer is received, which has a conductive pad, a first surface and a second surface opposite to the first surface. A through hole is formed extending in a direction from the second surface to the first surface to expose the conductive pad. Then, the wafer is rotated, and a flowing insulating material sprayer is used to spray a flowing insulating material, and the flowing insulating material sprayer includes a nozzle and a nozzle moving unit. The nozzle is configured to spray the flowing insulating material on the second surface and in the through hole of the wafer, and the nozzle moving unit is connected to the nozzle to move the nozzle back and forth in an axial direction above the wafer. After that, the flowing insulating material is cured.

In various embodiments of the present disclosure, the method further includes tilting the wafer to form a first acute angle between the wafer and direction of gravity.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
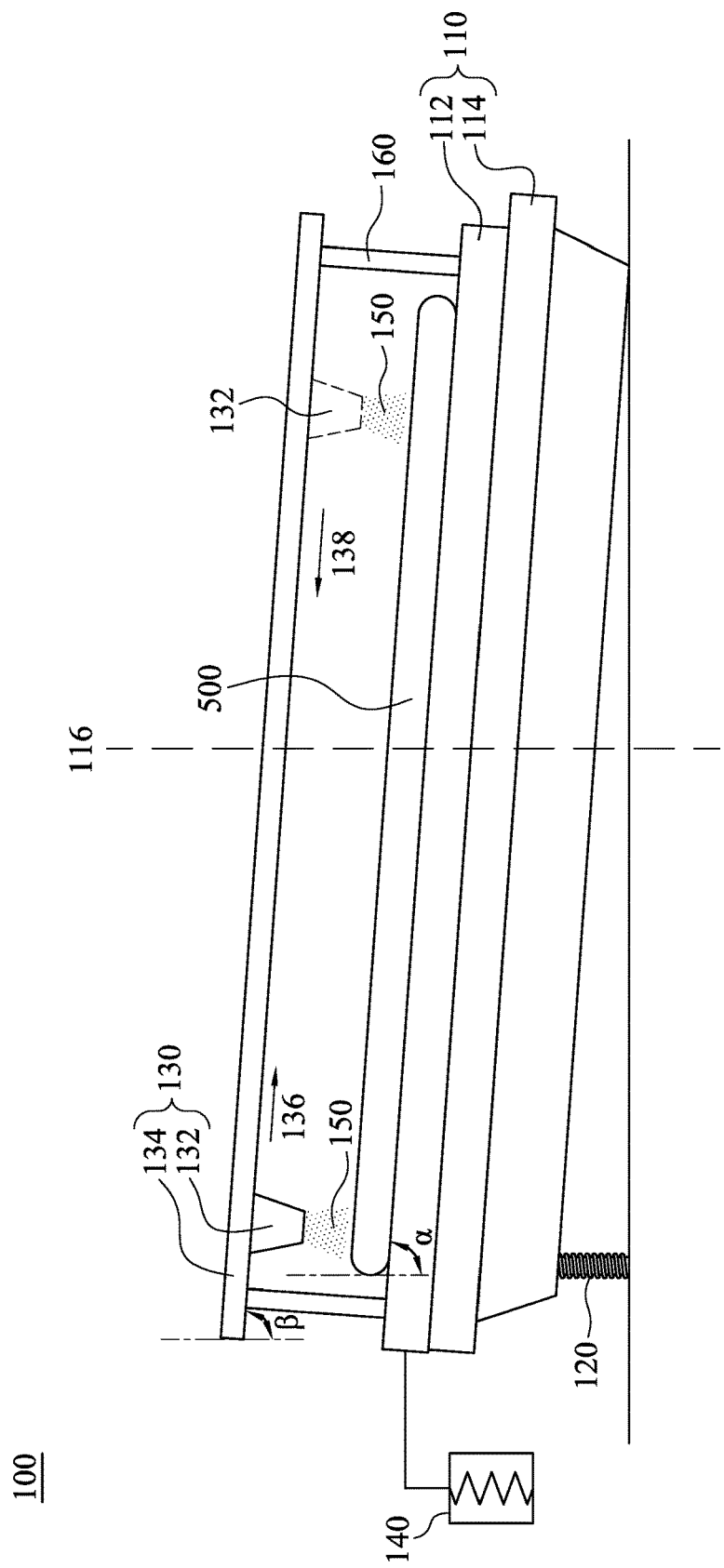
FIG. 1 illustrates a cross-sectional view of a wafer coating system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Refer to FIG. 1, which illustrates a cross-sectional view of a wafer coating system, in accordance with some embodiments of the present disclosure. As shown in FIG. 1, the wafer coating system 100 includes a wafer chuck 110, a wafer tilting lifting pin 120 and a flowing insulating material sprayer 130. The wafer chuck 110 includes a carrier part 112 and a rotating part 114, which the carrier part 112 is mounted on the rotating part 114 to carry a wafer 500, and the rotating part 114 is configured to rotate with a predetermined axis 116.

The wafer tilting lifting pin 120 is below the wafer chuck 110. The wafer tilting lifting pin 120 is configured to heighten or lower a height of one side of the wafer chuck 110, so as to form a first acute angle α between the wafer 500 on the wafer chuck 110 and direction of gravity. The flowing insulating material sprayer 130 is above the wafer chuck 110 and configured to spray a flowing insulating material 150 to the wafer.

Figure 2:
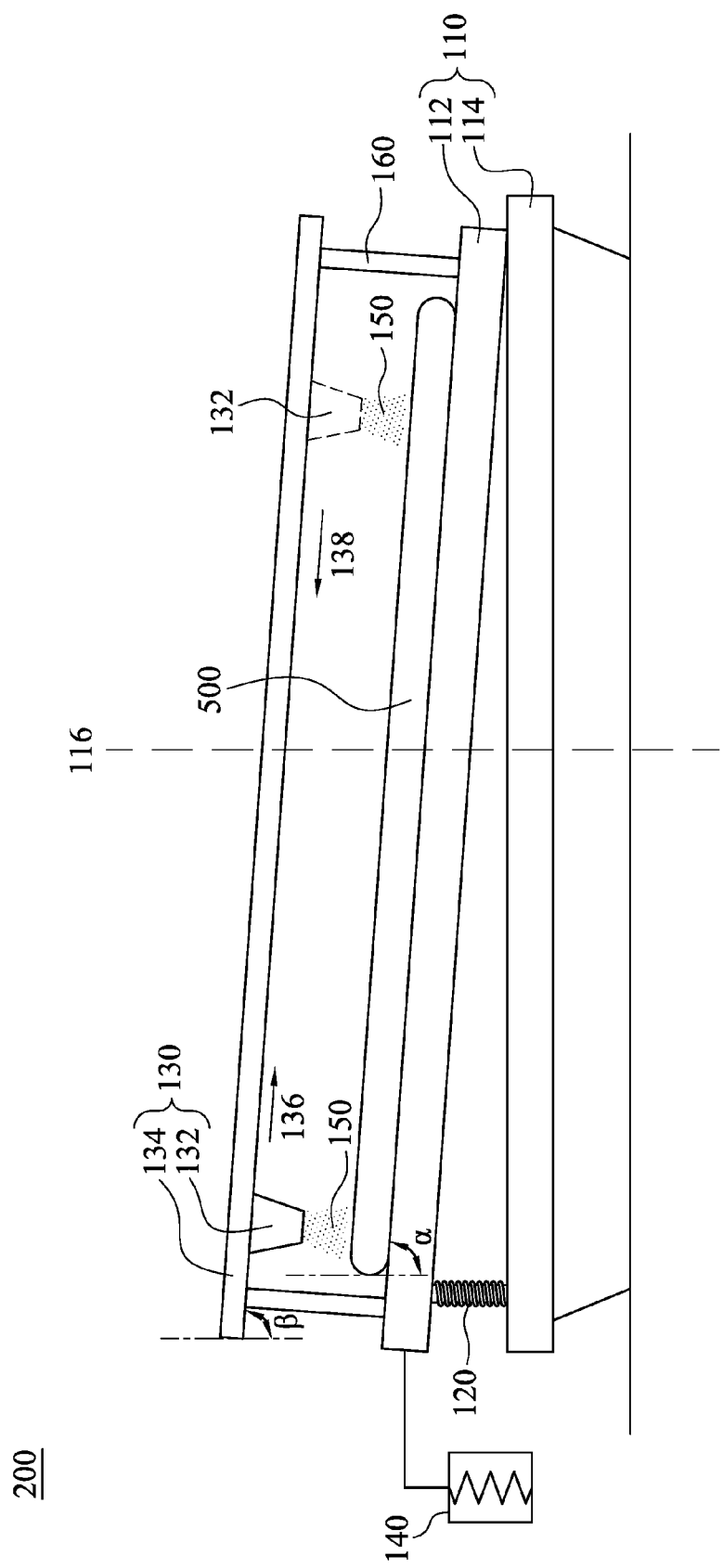
FIG. 2 illustrates a cross-sectional view of a wafer coating system, in accordance with some other embodiments of the present disclosure.

It is worth noting that the position of the wafer tilting lifting pin 120 is not limited to FIG. 1. Refer to FIG. 2, which illustrates a cross-sectional view of a wafer coating system, in accordance with some other embodiments of the present disclosure. In FIG. 2, same reference numbers are used in the drawings and the description to refer to the same or like parts in FIG. 1, and the details are not described herein. The difference between a wafer coating system 200 of FIG. 2 and the wafer coating system 100 of FIG. 1 is that the wafer tilting lifting pin 120 in FIG. 2 is disposed between the carrier part 112 and the rotating part 114 of the wafer chuck 110. The wafer tilting lifting pin 120 is configured to heighten or lower a height of one side of the carrier part 112 and also able to form a first acute angle α between the wafer 500 on the carrier part 112 and direction of gravity.

Refer back to FIG. 1. Specifically, the flowing insulating material 150 covers a surface of the wafer 500 and further enters a through hole of the wafer 500 to cover a bottom and a sidewall of the through hole as an isolation layer. The first acute angle α between the wafer 500 and direction of gravity make the flowing insulating material flow 150 from the bottom to the sidewall of the through hole, so the flowing insulating material flow 150 would not be accumulated to a great thickness at the bottom of the through hole. In addition, the first acute angle α also avoids the flowing insulating material 150 on the surface of the wafer 500 being affected by the gravity to flow toward the bottom of the through hole, and thus maintains excellent insulating property of the wafer 500. In some embodiments, the wafer tilting lifting pin 120 is configured to control the first acute angle α in a range from 45 degrees to 89 degrees. In some other embodiments, the wafer tilting lifting pin 120 is configured to control the first acute angle α in a range from 70 degrees to 89 degrees. In some other embodiments, the wafer tilting lifting pin 120 is configured to control the first acute angle α in a range from 85 degrees to 89 degrees.

During the process of spraying the flowing insulating material 150, the rotating part 114 rotates the wafer 500 with the predetermined axis 116, so as to uniformly flow the flowing insulating material 150 toward the sidewalls of each direction. In addition, the wafer coating system 100 further includes a heater 140 connected to carrier part 112. The heater 140 provides thermal energy to the carrier part 112 to heat and cure the flowing insulating material 150 sprayed to the wafer 500, and thus completes the step of preparing the isolation layer. In some embodiments, a suitable rotational speed of the rotating part 114 is adjusted to correspond the requirement of the process, so as to prepare the uniform isolation layer.

The flowing insulating material sprayer 130 includes a nozzle 132 and a nozzle moving unit 134. The nozzle 132 is configured to spray the flowing insulating material 150, and the nozzle moving unit 134 is configured to move the nozzle 132 back and forth in an axial direction above the wafer 500. Particularly, the wafer 500 has a plurality of chip districts, and these chip districts are separated to independent chip packages after dicing the wafer 500. When the rotating part 114 is rotated with the predetermined axis 116, the nozzle moving unit 134 simultaneously moves the nozzle 132 back and forth along directions 136 and 138. As such, the nozzle 132 is axially moved to positions above the chip districts and uniformly spraying the flowing insulating material to each chip district.

Continuing in FIG. 1, the wafer coating system 100 further includes a connecting rod 160, which is configured to connect the carrier part 112 and the nozzle moving unit 134 of the flowing insulating material sprayer 130. As such, the nozzle moving unit 134 is also tilted when tilting the wafer 500 and form a second acute angle β between the nozzle moving unit 134 and direction of gravity, and the second acute angle β is the same as the first acute angle α to ensure a vertical distance between the nozzle 132 and the wafer 500 is maintained at a constant value. Therefore, the nozzle 132 sprays the flowing insulating material 150 to each chip district in a direction substantially vertical to the wafer 500.

Figure 3:
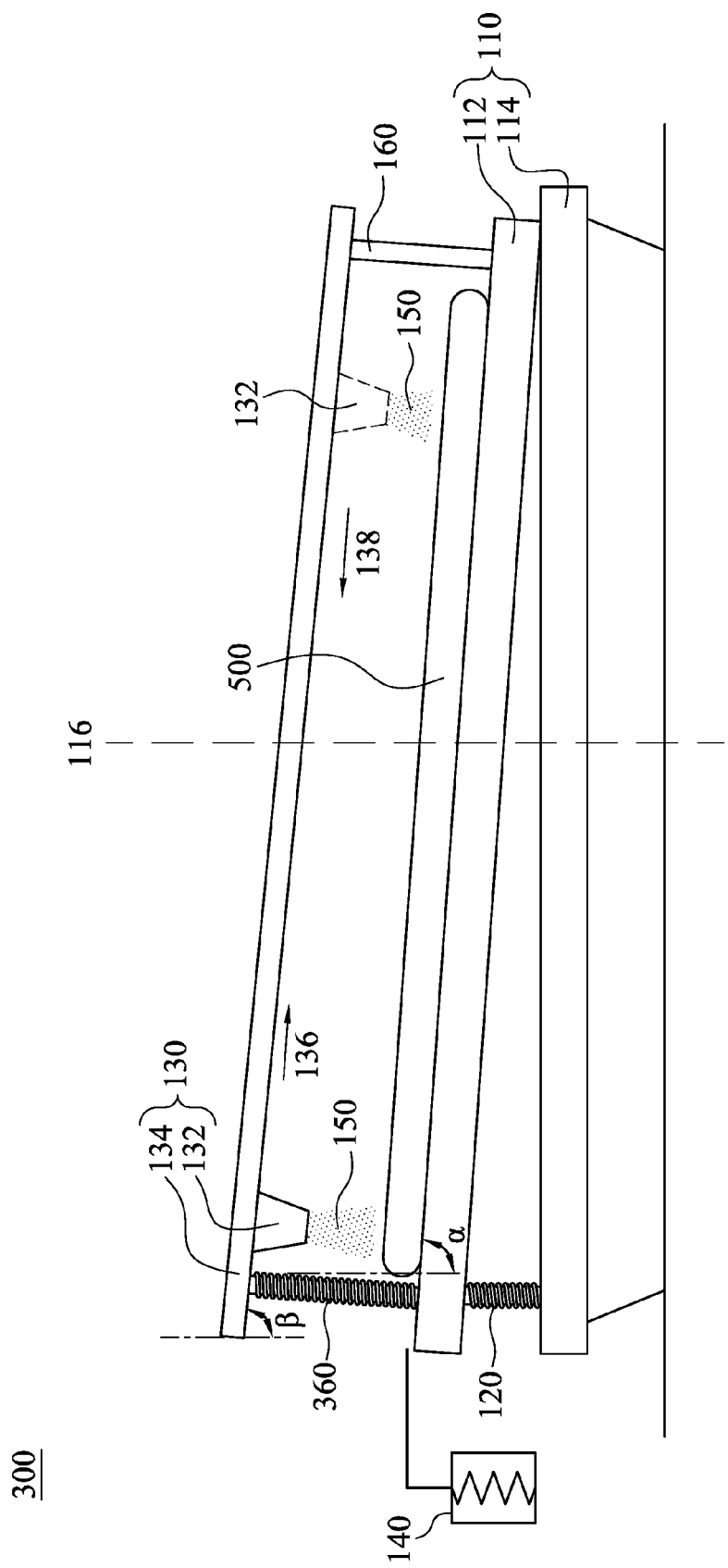
FIG. 3 illustrates a cross-sectional view of a wafer coating system, in accordance with some other embodiments of the present disclosure.

In some embodiments, the second acute angle β is different from the first acute angle α. Refer to FIG. 3, which illustrates a cross-sectional view of a wafer coating system, in accordance with some other embodiments of the present disclosure. In FIG. 3, same reference numbers are used in the drawings and the description to refer to the same or like parts in FIG. 1, and the details are not described herein. The difference between a wafer coating system 300 of FIG. 3 and the wafer coating system 100 of FIG. 1 is that the wafer coating system 300 further includes a nozzle moving unit tilting lifting pin 360 disposed between the carrier part 112 and the nozzle moving unit 134 to heighten or lower a height of one side of the nozzle moving unit 134 and able to form a second acute angle β between the nozzle moving unit 134 and direction of gravity. The nozzle moving unit tilting lifting pin 360 is able to form the second acute angle β different from the first acute angle α, so the vertical distance between the nozzle 132 and the wafer 500 is changed when moving the nozzle 132. In addition, the nozzle 132 is no longer vertically aligned to the wafer 500, instead, the nozzle 132 obliquely sprays the flowing insulating material 150 to each chip district of the wafer 500. Described in different ways, obliquely spraying the flowing insulating material 150 increases an amount of the flowing insulating material 150 deposited on the sidewalls of the through hole, and further reduces the thickness of the flowing insulating material 150 at the bottom of the through hole.

Figure 4:
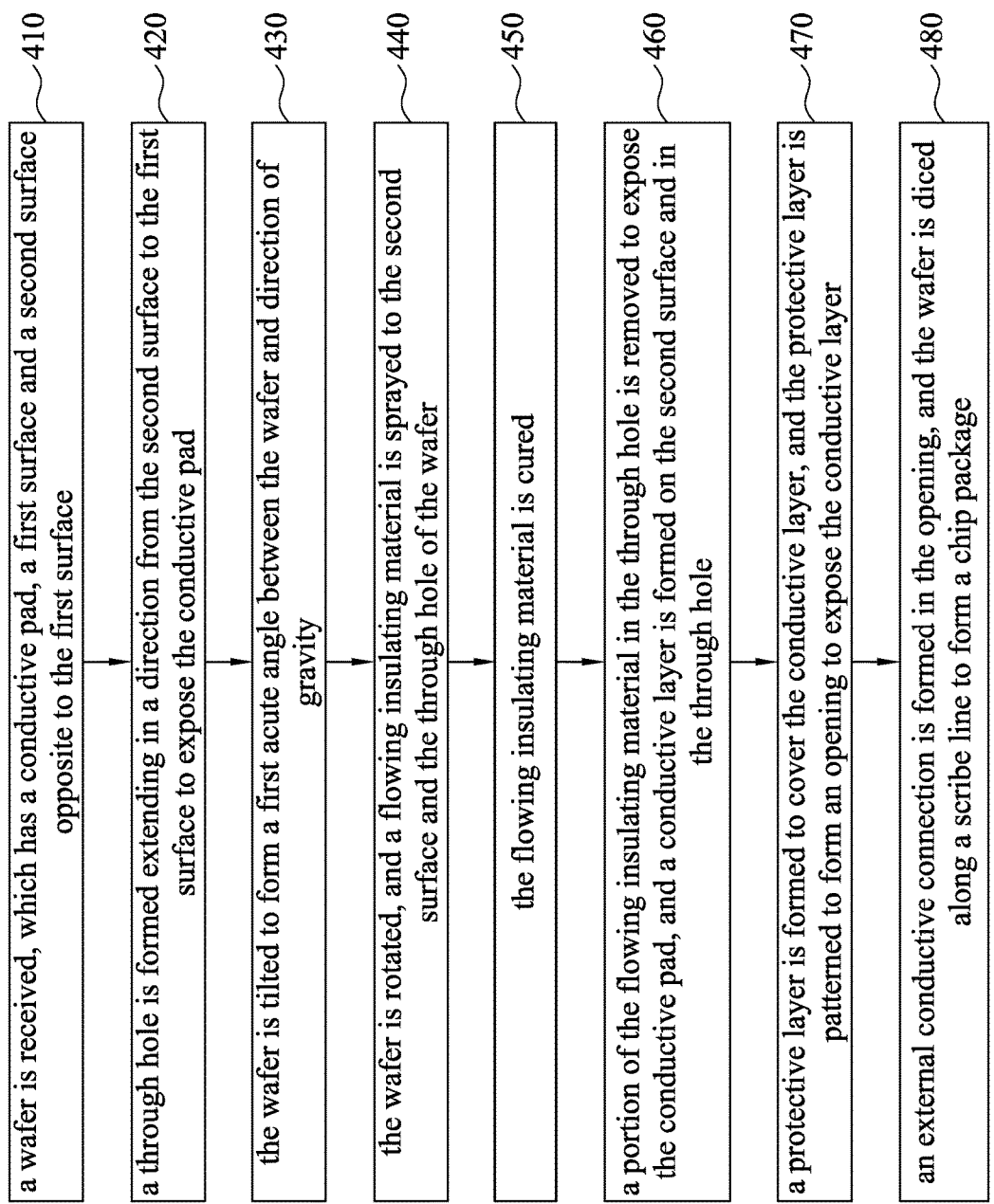
FIG. 4 illustrates a flow chart of a method of fabricating the chip package, in accordance with various embodiments.

Refer to FIG. 4, which illustrates a flow chart of a method of fabricating the chip package, in accordance with various embodiments. Refer to FIGS. 5A to 5F at the same time to further understand the fabricating process of the chip package. FIGS. 5A to 5F are cross-sectional views of the chip package at intermediate stages of fabrication, in accordance with various embodiments.

Figure 5A:
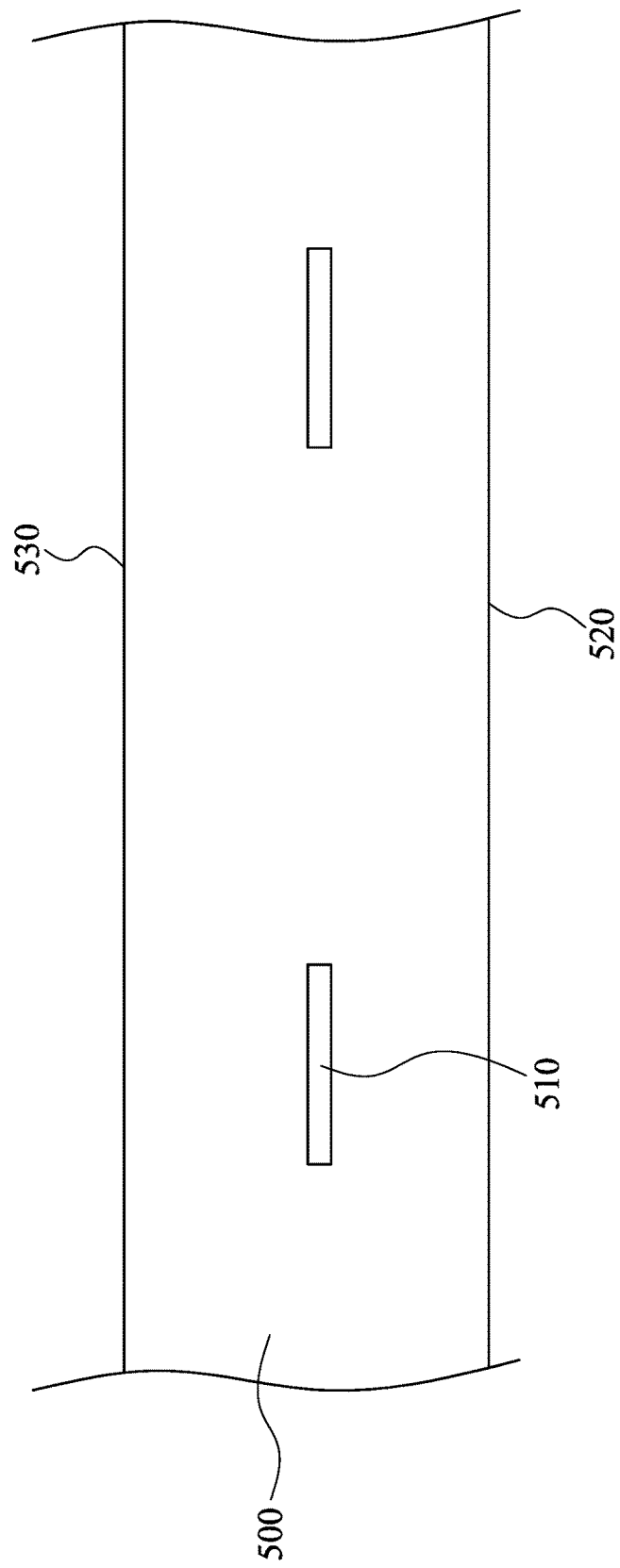
FIGS. 5A to 5F are cross-sectional views of the chip package at intermediate stages of fabrication, in accordance with various embodiments.

Refer to step 410 and FIG. 5A, a wafer 500 is received, which has a conductive pad 510, a first surface 520 and a second surface 530 opposite to the first surface 510. In addition, the wafer 500 has a plurality of chip districts, and these chip districts are separated to independent chip packages after dicing the wafer 500. In some embodiments, the wafer includes a semiconductor device, an inter-layer dielectric layer (ILD), an inter-metal dielectric layer (IMD) and an interconnection structure, and the conductive pad 510 is one of metal layers of the interconnection structure.

Figure 5B:
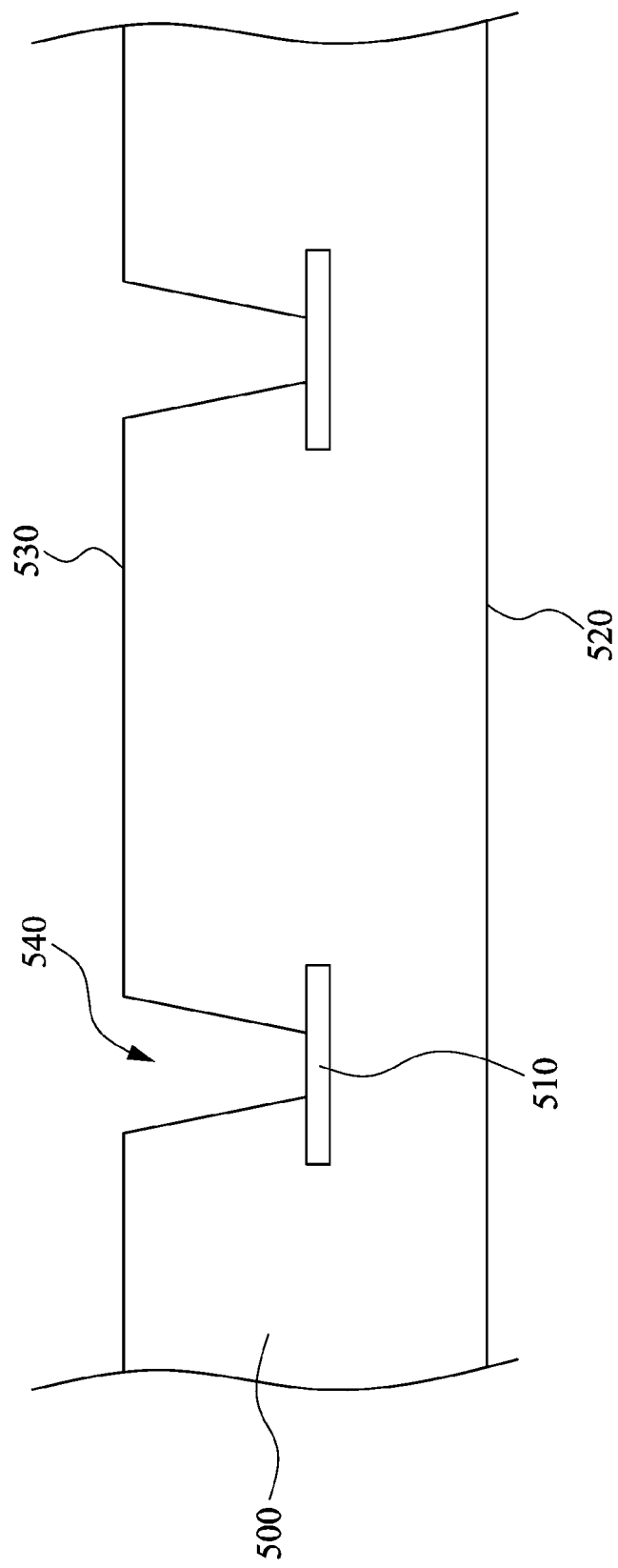

Refer to step 420 and FIG. 5B, a through hole 540 is formed extending in a direction from the second surface 530 to the first surface 520 to expose the conductive pad 510. The through hole 540 is formed by photolithography etching, but not limited thereto.

Figure 5C:
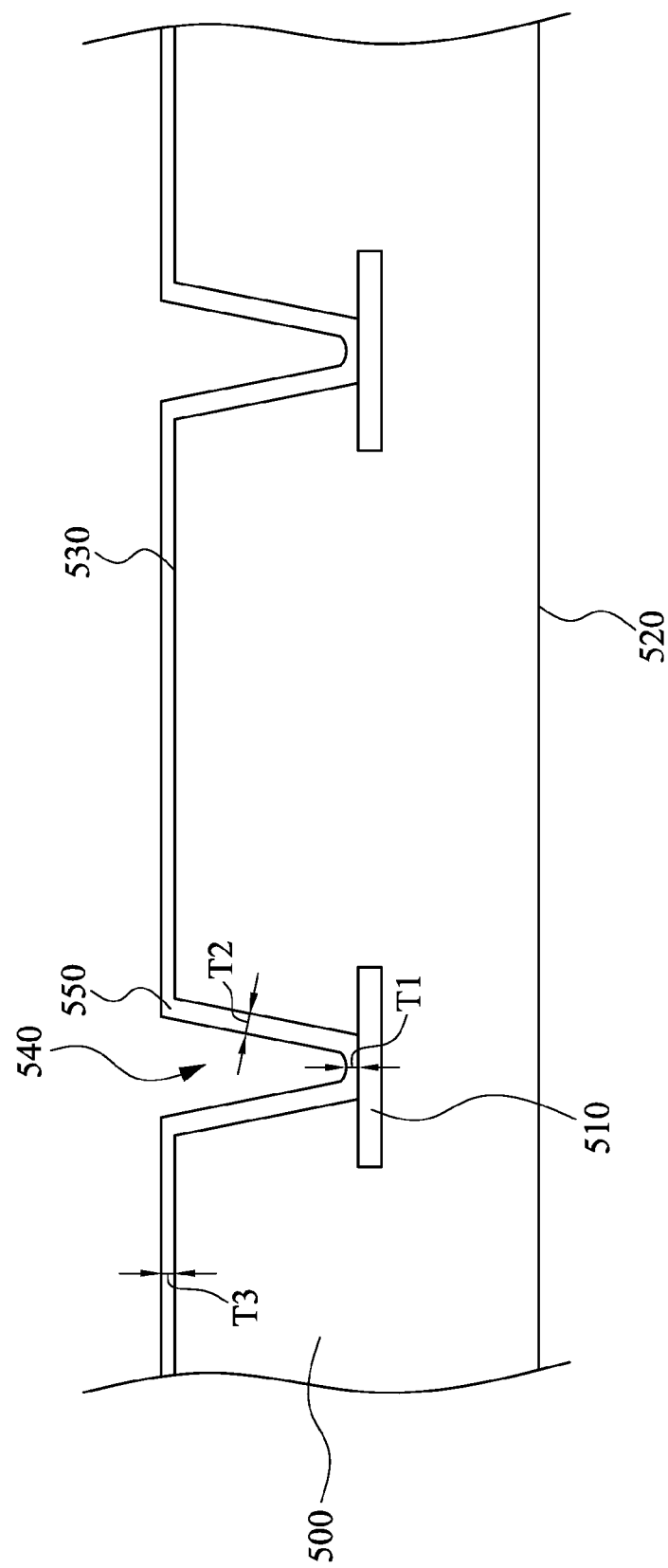
Figure 6:
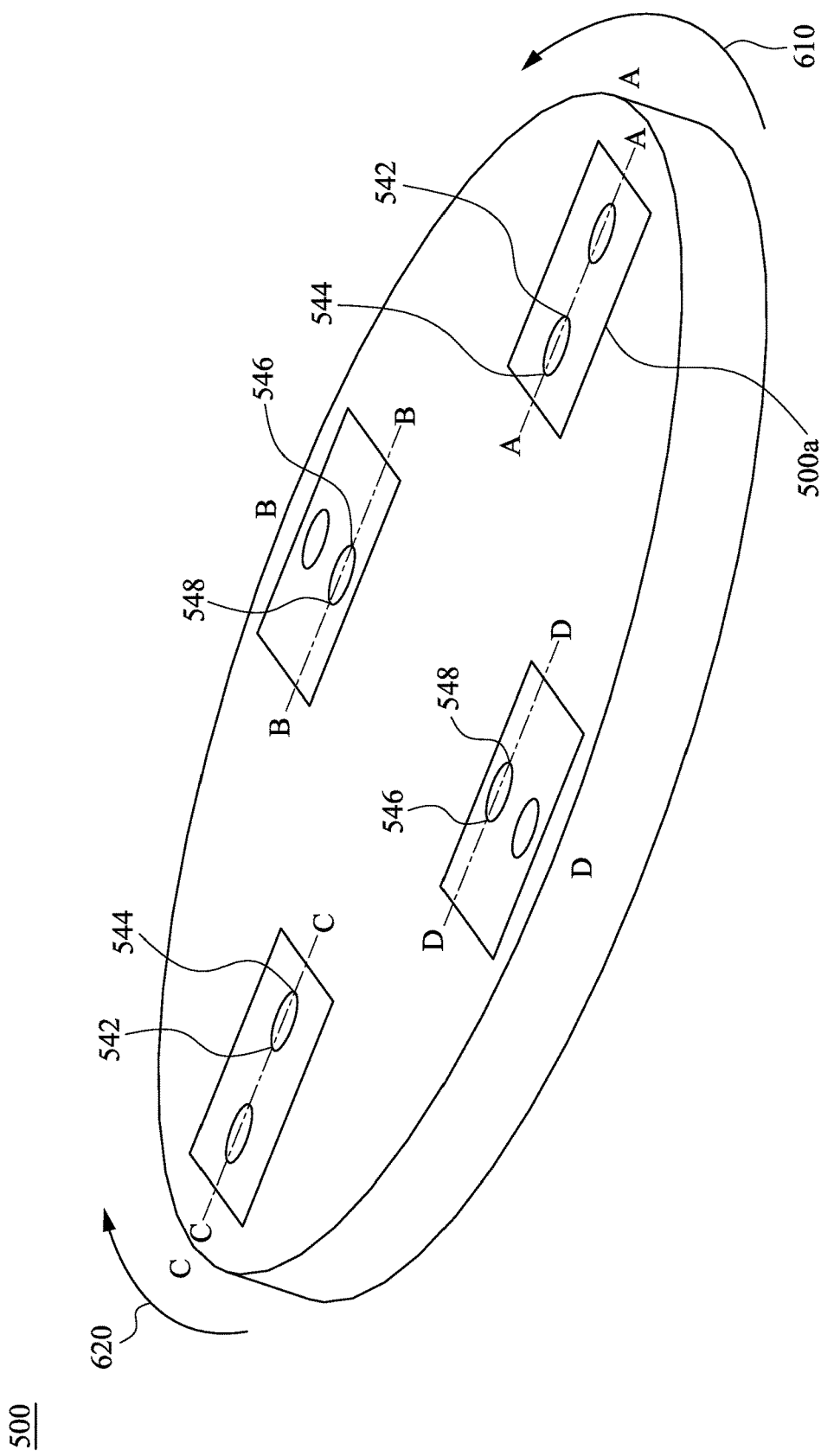
FIG. 6 illustrates the schematic view of tilting the wafer, in accordance with some embodiments of the present disclosure.

Refer to step 430 and FIG. 5C, the wafer 500 is tilted to form a first acute angle α between the wafer 500 and direction of gravity. The wafer 500 is placed on the wafer chuck 110 of the wafer coating system 100 in FIG. 1, and the wafer tilting lifting pin 120 is used to control a height of one side of the wafer chuck 110, so as to tilt the wafer 500. To be noticed, the present disclosure is not limited thereto; any suitable methods could be used to tilt the wafer 500, without affecting the spirit of the present disclosure. Refer to FIG. 6 at the same time, which illustrates the schematic view of tilting the wafer 500, in accordance with some embodiments of the present disclosure. In FIG. 6, only one chip district 500a is shown on the wafer 500 for clearly describing the present disclosure, but it should be understand that the wafer 500 has multiple chip districts 500a, and scribe lines separate these chip districts. In addition, the first acute angle α is between the wafer 500 and direction of gravity. In some embodiments, the first acute angle α is in a range from 45 degrees to 89 degrees. In some other embodiments, the first acute angle α is in a range from 70 degrees to 89 degrees. In some other embodiments, the first acute angle α in a range from 85 degrees to 89 degrees.

In the present embodiments, the wafer 500 is tilted after forming the through hole 540, but not limited thereto. In some other embodiments, the wafer 500 is tilted before forming the through hole 540.

Continuing to step 440, the wafer 500 is rotated, and a flowing insulating material 550 is sprayed to the second surface 530 and the through hole 540 of the wafer 500. In this step, the flowing insulating material sprayer 130 of the wafer coating system 100 is used to spray the flowing insulating material 550, and the rotating part 114 rotates the wafer 500 with the predetermined axis 116. For example, the wafer 500 is rotated along a direction 610 or a direction 620. As aforementioned, the nozzle 132 is axially moved forth and back above the wafer 500 by the nozzle moving unit 134, so as to uniformly spray the flowing insulating material 550 to each chip district 500a. In addition, a second acute angle β between the nozzle moving unit 134 and direction of gravity could be the same as or different from the first acute angle α. In some embodiments, a rotational speed of the wafer 500 is adjusted to correspond the requirement of the process.

Continuing in FIGS. 7A to 7D to understand mechanism of spraying the flowing insulating material 550 to the wafer 500. FIGS. 7A to 7D are cross-sectional views of the wafer district 500a along different section lines during the rotation of the wafer 500.

Figure 7A:
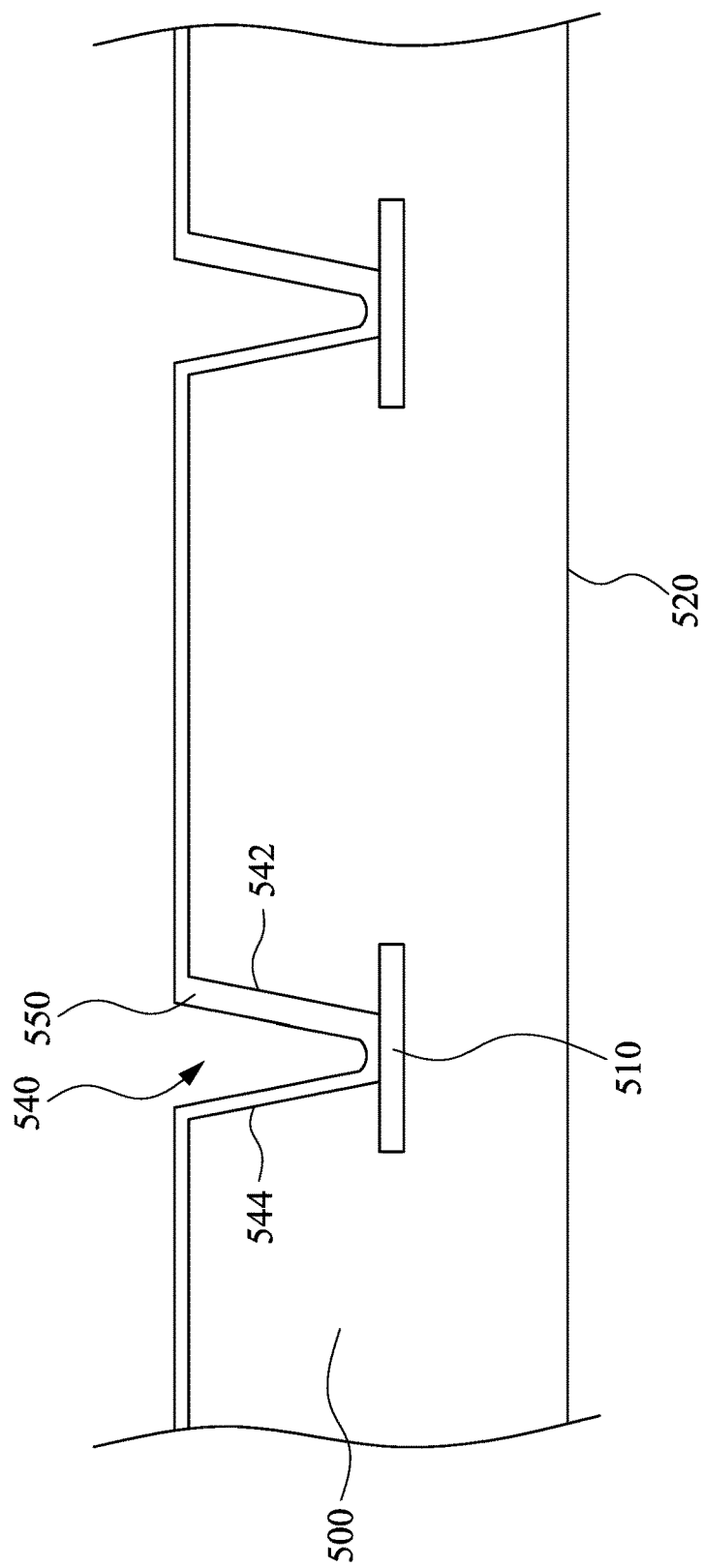
FIG. 7A is a cross-sectional view of the wafer district along a section line AA when the wafer district is at position A in FIG. 6.

Refer first to FIG. 6 and FIG. 7A. FIG. 7A is a cross-sectional view of the wafer district 500a along a section line AA when the wafer district 500a is at position A in FIG. 6. As shown in FIG. 6 and FIG. 7A, owing to the first acute angle α between the wafer 500 and direction of gravity, the flowing insulating material 550 having high flowability will flow to aggregate at a right sidewall 542 of the through hole 540. As such, a thickness of the flowing insulating material 550 on the right sidewall 542 is increased, and thus a thickness of the flowing insulating material 550 on a left sidewall 544 of through hole 540 is correspondingly decreased.

Figure 7B:
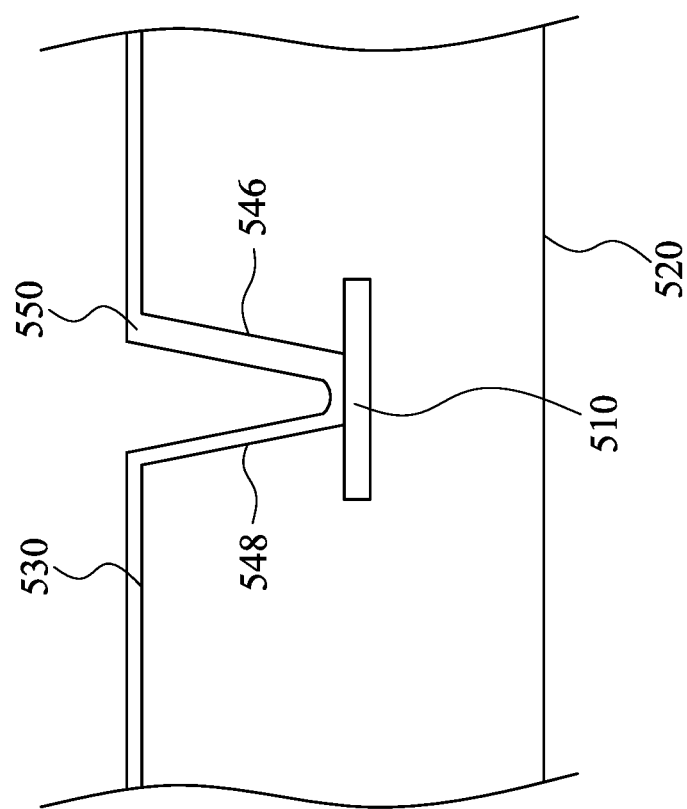
FIG. 7B is a cross-sectional view of the wafer district along a section line BB when the wafer district is at position B in FIG. 6.

Continuing in FIG. 6 and FIG. 7B. FIG. 7B is a cross-sectional view of the wafer district 500a along a section line BB when the wafer district 500a is at position B in FIG. 6. As shown in FIG. 6 and FIG. 7B, the wafer 500 is rotated along the direction 610 to move the wafer district 500a to position B, and the flowing insulating material 550 flows to aggregate at a front sidewall 546 of the through hole 540 by the first acute angle α between the wafer 500 and direction of gravity. As such, a thickness of the flowing insulating material 550 on the front sidewall 546 is increased. Relatively, a thickness of the flowing insulating material 550 on a back sidewall 548 of through hole 540 is decreased.

Figure 7C:
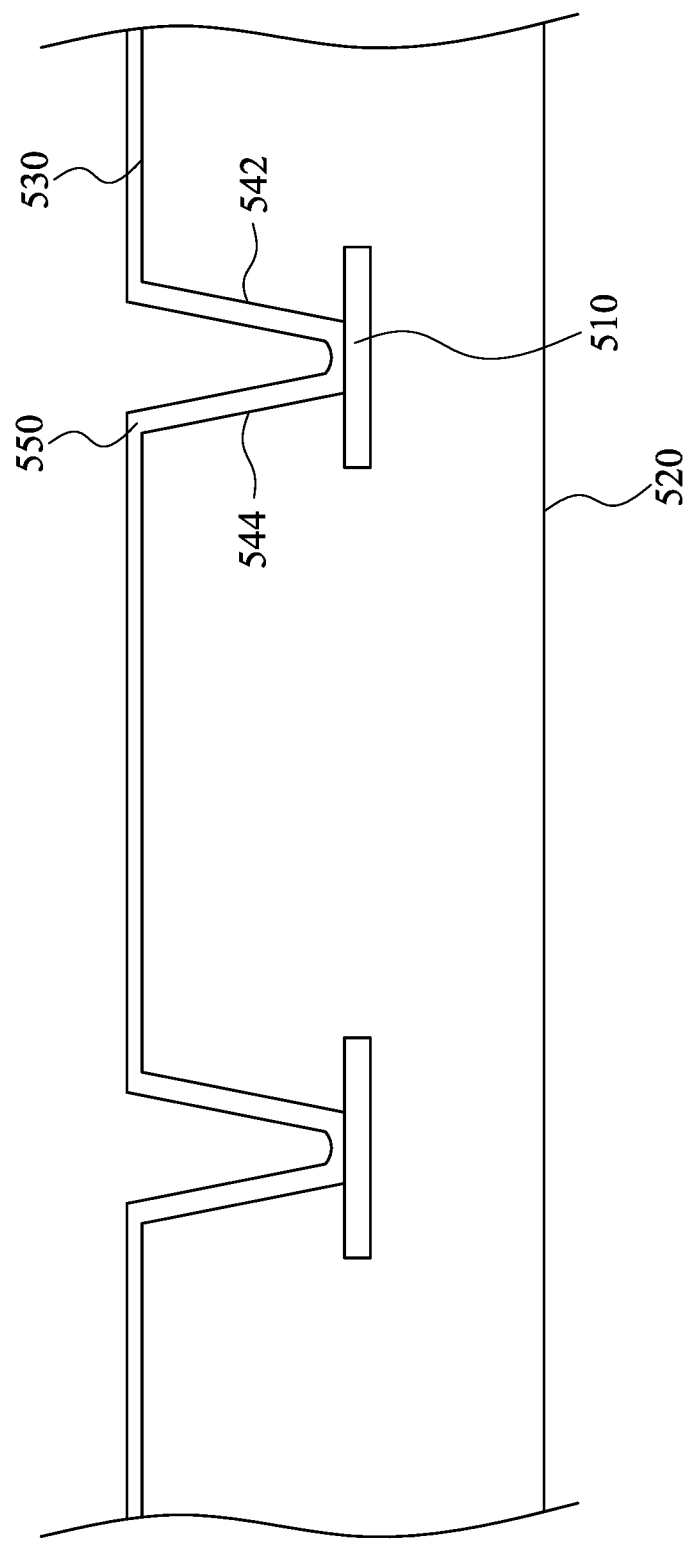
FIG. 7C is a cross-sectional view of the wafer district along a section line CC when the wafer district is at position C in FIG. 6.

Continuing in FIG. 6 and FIG. 7C. FIG. 7C is a cross-sectional view of the wafer district 500a along a section line CC when the wafer district 500a is at position C in FIG. 6. As shown in FIG. 6 and FIG. 7C, the wafer 500 is continually rotated along the direction 610 to move the wafer district 500a to position C. Owing to the first acute angle α between the wafer 500 and direction of gravity, a portion of the flowing insulating material 550 will flow from the right sidewall 542 to the left sidewall 544. As such, the thickness of the flowing insulating material 550 on the left sidewall 544 is increased, and thus relatively decreases the thickness of the flowing insulating material 550 on the right sidewall 542. Therefore, the flowing insulating material 550 on the left sidewall 544 and on the right sidewall 542 substantially have the same thickness.

Figure 7D:
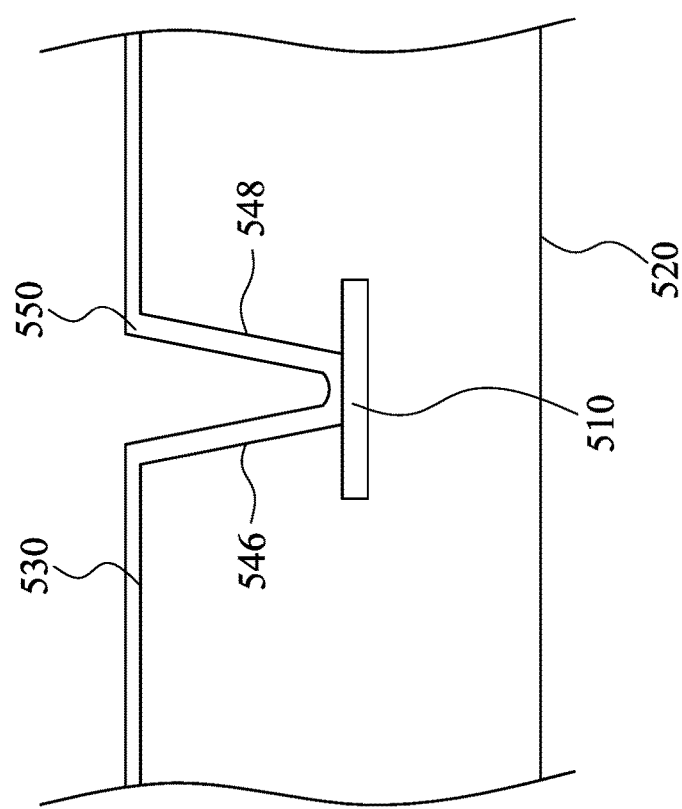
FIG. 7D is a cross-sectional view of the wafer district along a section line DD when the wafer district is at position D in FIG. 6.

Continuing in FIG. 6 and FIG. 7D. FIG. 7D is a cross-sectional view of the wafer district 500a along a section line DD when the wafer district 500a is at position D in FIG. 6. As shown in FIG. 6 and FIG. 7C, the wafer 500 is continually rotated along the direction 610 to move the wafer district 500a to position D. Owing to the first acute angle α between the wafer 500 and direction of gravity, a portion of the flowing insulating material 550 will flow from the front sidewall 546 to the back sidewall 548. As such, the thickness of the flowing insulating material 550 on the back sidewall 548 is increased, and thus relatively decreases the thickness of the flowing insulating material 550 on the front sidewall 546. Therefore, the flowing insulating material 550 on the front sidewall 546 and on the back sidewall 548 substantially have the same thickness.

Given the above, the wafer 500 is tilted to make the flowing insulating material 550 having high flowability flow toward the sidewalls of the through hole 540, so the flowing insulating material 550 accumulated at the bottom of the through hole 540 could be reduced, which is benefit for the subsequent processes. In addition, the first acute angle α avoids the flowing insulating material 550 on the second surface 530 of the wafer 500 being affected by the gravity and flow toward the bottom of the through hole 540, and thus maintains excellent insulating property of the wafer 500. Furthermore, the steps of FIGS. 7A to 7D could be repeated to ensure that the flowing insulating material 550 on the sidewall of each direction is substantially uniform. It is worthy noting that, the mechanism of spraying the flowing insulating material 550 to four sidewalls of the through hole 540 illustrated in FIGS. 7A to 7D is only for clear description, but the present disclosure is not limited thereto. Person having ordinary skill In the art should understand that rotating the wafer 500 is a continuous motion, so as to make the flowing insulating material 550 on the sidewall of each direction of the through hole 540 be substantially uniform.

In some embodiments, the wafer 500 is not rotated. Instead, a tilting angle is varied during the step of spraying the flowing insulating material 550. For example, the wafer tilting lifting pin 120 is regulated to tilt the wafer 500 forward, backward, right, left, or any directions, so as to flow the flowing insulating material 550 to the sidewall of each direction.

Continuing to step 450 and FIG. 5C, the flowing insulating material 550 is cured. The heater 140 of the wafer spraying system 100 provides thermal energy to the carrier part 112 to cure the flowing insulating material 550 sprayed on the wafer 500, and a temperature of curing the flowing insulating material 550 is between 35° C. to 45° C. In some embodiments, the wafer 500 is placed horizontally after curing the flowing insulating material 550 to process following steps. Specifically, the wafer tilting lifting pin 120 is again regulated to make the wafer 500 parallel to the horizontal plane. As shown in FIG. 5C, after curing, the flowing insulating material 550 has a thickness T1 on the bottom of the through hole 540, a thickness T2 on the sidewall of the through hole 540 and a thickness T3 on the second surface 530. It should be noted that, the wafer 500 is tilted to ensure that the flowing insulating material 550 at a junction of the second surface 530 and the sidewall of the through hole 540 is maintained at a certain thickness, which will not flow to and accumulate at the bottom of the through hole 540, and thus increases insulating property of the second surface 530. Therefore, the flowing insulating material 550 would not be accumulated to a great thickness at the bottom of the through hole 540. In some embodiments, the thickness T1, T2 and T3 are substantially the same. In some other embodiments, the thickness T3 is greater than thickness T2, and the thickness T2 is greater than thickness T1.

Figure 5D:
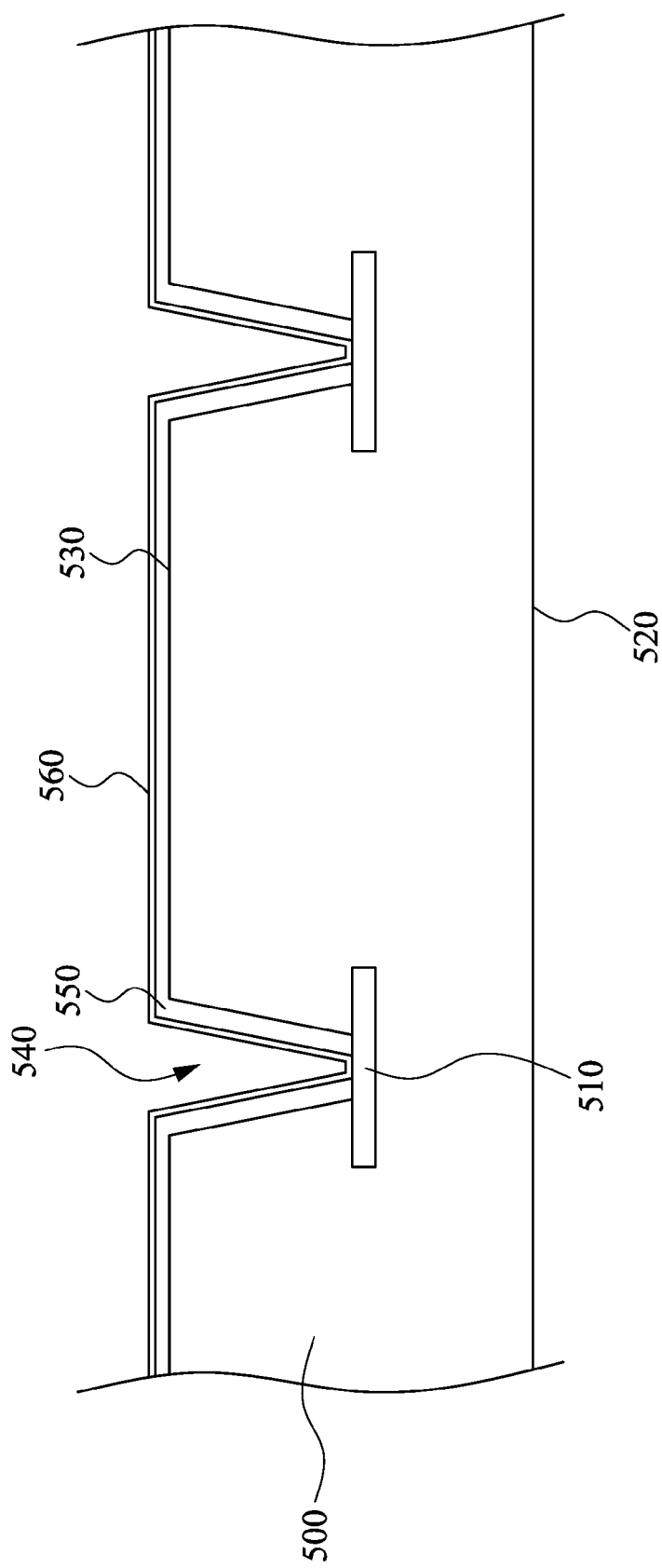

Continuing to step 460 and FIG. 5D, a portion of the flowing insulating material 550 in the through hole 540 is removed to expose the conductive pad 510, and a conductive layer 560 is formed on the second surface 530 and in the through hole 540. In the present disclosure, the flowing insulating material 550 is a photosensitive epoxy, which is directly patterned without using a photoresist layer. As such, a pattern of the flowing insulating material 550 is defined by photolithography etching, and a photoresist layer is not necessary anymore. After the patterning process, the flowing insulating material 550 at the bottom of the through hole is removed to expose the conductive pad 510 from the through hole 540. Then, a conductive material is deposited on the flowing insulating material 550 and the conductive pad 510 by sputtering, evaporating, electroplating or electroless plating, so as to form the conductive layer 560. As aforementioned, the wafer is tilted to reduce the thickness T1 of the flowing insulating material 550 on the bottom of the through hole 540, so as to avoid the generation of undercut profile when patterning the flowing insulating material 550 having great thickness, which the undercut profile will easily induces the disconnection of the subsequently formed conductive layer 560. In some embodiments, the conductive layer 560 includes aluminum, copper, nickel or other suitable conductive materials.

Figure 5E:
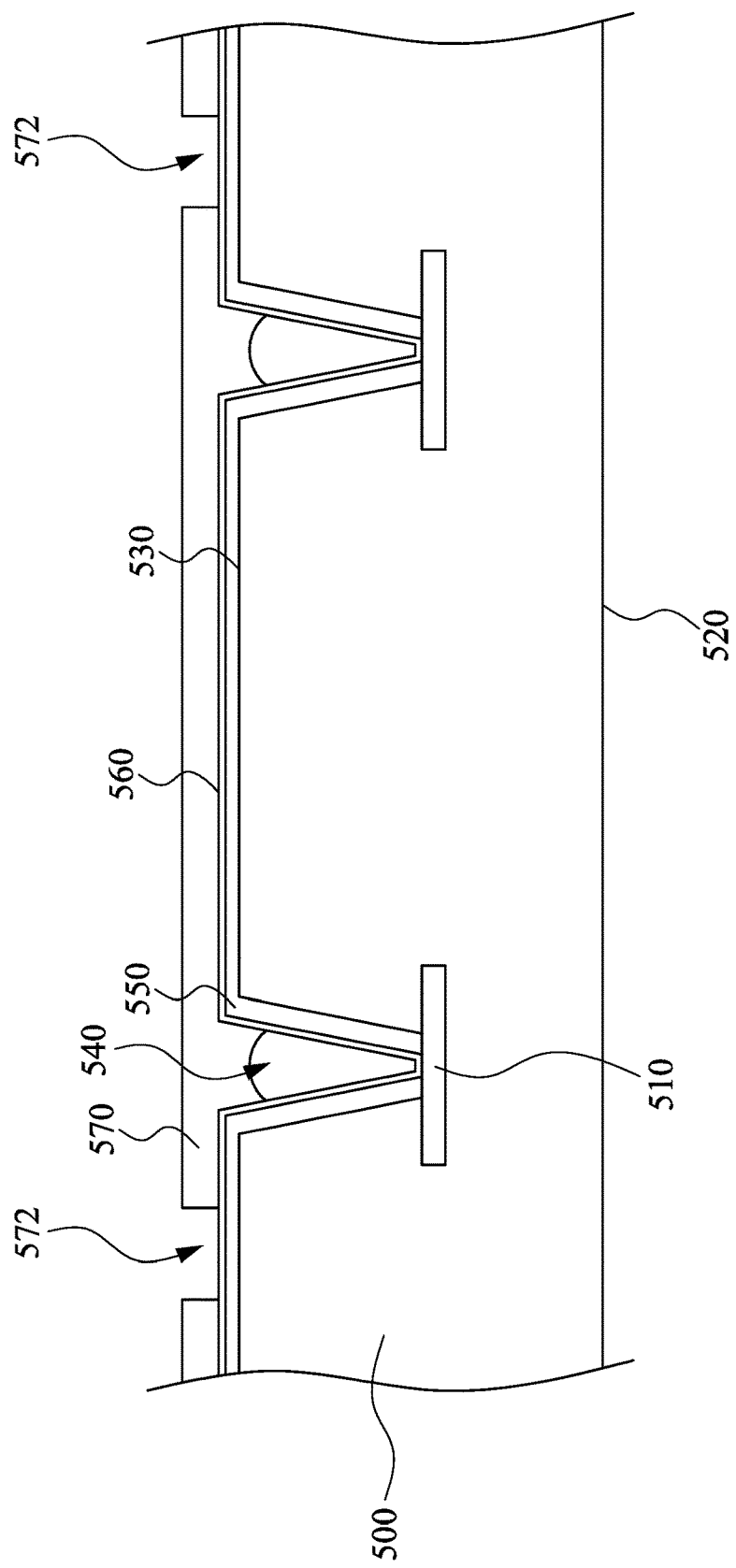

Continuing to step 470 and FIG. 5E, a protective layer 570 is formed to cover the conductive layer 560, and the protective layer 570 is patterned to form an opening 572 to expose the conductive layer 560. In this step, an epoxy material is brush-coated on the conductive layer 560 to form the protective layer 570. Then, the protective layer 570 is pattered to form the opening 572, so as to expose a portion of the conductive layer 560 from the opening 572 of the protective layer 570.

Figure 5F:
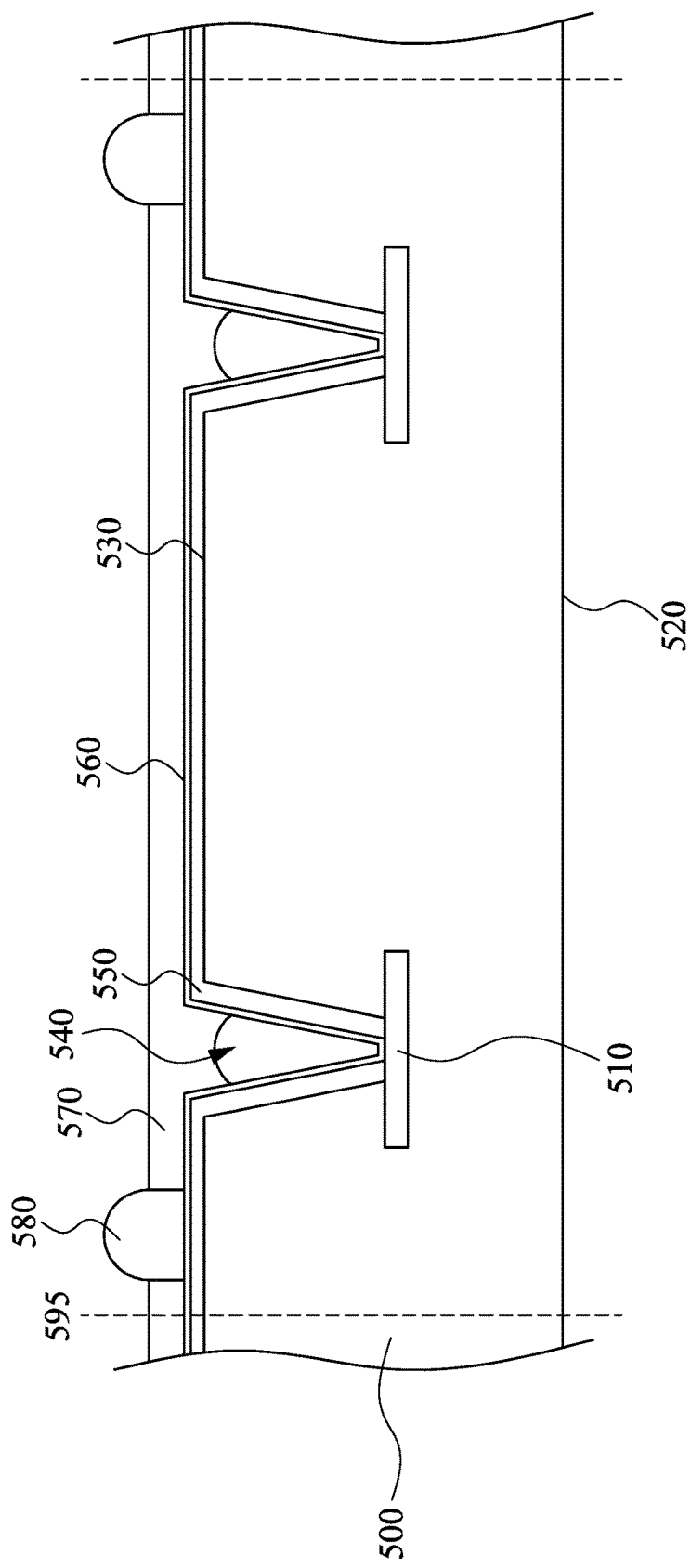

Continuing to step 480 and FIG. 5F, an external conductive connection 580 is formed in the opening 572, and the wafer 500 is diced along a scribe line 595 to form a chip package. The external conductive connection 580 includes a solder ball, a bump or other well-known structures in the industry, and a shape of the external conductive connection 580 includes spherical, oval, square or rectangular, but not limited thereto. After forming the external conductive connection 580, the wafer 500, the flowing insulating material 550, the conductive layer and the protective layer are diced along the scribe line 595 to separate these chip districts 500a of the wafer 500, and the independent chip package is formed.

The embodiments of the present disclosure discussed above have advantages over existing methods and structures, and the advantages are summarized below. The wafer coating system provided by the present disclosure could be applied to spray the flowing insulating material to the wafer, so as to form the isolation layer. In this process, the tilted wafer make the flowing insulating material on a surface and a sidewall of a through hole not easily flow to a bottom of the through hole. As such, a uniform isolation layer could be formed to further increase insulating property of the chip package. Most importantly, a thickness of the flowing insulating material on the bottom of the through hole is reduced to decrease the probability of forming undercut profile, and further avoids the disconnection of the subsequently formed conductive layer. Summarized above points, the wafer coating system and the fabricating method of the chip package sufficiently increase the yield of the process and decrease the costs.

Although the present invention has been described in considerable detail with reference to certain embodiments thereof, other embodiments are possible. Therefore, the spirit and scope of the appended claims should not be limited to the description of the embodiments contained herein. Reference will now be made in detail to the embodiments of the invention, examples of which are illustrated in the accompanying drawings. Wherever possible, the same reference numbers are used in the drawings and the description to refer to the same or like parts.

What is claimed is:

1. A wafer coating system, comprising:
   a wafer chuck having a carrier part and a rotating part, the carrier part being mounted on the rotating part to carry a wafer, and the rotating part being configured to rotate with a predetermined axis;
   a flowing insulating material sprayer above the wafer chuck and configured to spray a flowing insulating material to the wafer; and
   a wafer tilting lifting pin configured to form a first acute angle between the wafer and direction of gravity.

2. The wafer coating system of claim 1, wherein the wafer tilting lifting pin is disposed below the wafer chuck.

3. The wafer coating system of claim 1, wherein the wafer tilting lifting pin is disposed between the carrier part and the rotating part.

4. The wafer coating system of claim 1, wherein the wafer tilting lifting pin is configured to control the first acute angle in a range from 45 degrees to 89 degrees.

5. The wafer coating system of claim 1, further comprising a heater connected to the carrier part to heat the wafer.

6. The wafer coating system of claim 1, wherein the flowing insulating material is a photosensitive epoxy.

7. A wafer coating system, comprising:
   a wafer chuck having a carrier part and a rotating part, the carrier part being mounted on the rotating part to carry a wafer, and the rotating part being configured to rotate with a predetermined axis;
   a flowing insulating material sprayer above the wafer chuck, and the flowing insulating material sprayer comprising:
      a nozzle configured to spray a flowing insulating material to the wafer; and
      a nozzle moving unit connected to the nozzle to move the nozzle back and forth in an axial direction above the wafer; and
   a wafer tilting lifting pin configured to form a first acute angle between the wafer and direction of gravity.

8. A wafer coating system, comprising:
   a wafer chuck having a carrier part and a rotating part, the carrier part being mounted on the rotating part to carry a wafer, and the rotating part being configured to rotate with a predetermined axis;
   a flowing insulating material sprayer above the wafer chuck, and the flowing insulating material sprayer comprising:
      a nozzle configured to spray a flowing insulating material to the wafer; and
      a nozzle moving unit connected to the nozzle to move the nozzle back and forth in an axial direction above the wafer; and
   a connecting rod connecting the carrier part and the nozzle moving unit.

9. The wafer coating system of claim 7, further comprising a nozzle moving unit tilting lifting pin disposed between the carrier part and the nozzle moving unit to form a second acute angle between the nozzle moving unit and direction of gravity.

10. The wafer coating system of claim 7, wherein the wafer tilting lifting pin is disposed below the wafer chuck.

11. The wafer coating system of claim 7, wherein the wafer tilting lifting pin is disposed between the carrier part and the rotating part.

12. The wafer coating system of claim 7, wherein the wafer tilting lifting pin is configured to control the first acute angle in a range from 45 degrees to 89 degrees.

13. The wafer coating system of claim 7, further comprising a heater connected to the carrier part to heat the wafer.

14. The wafer coating system of claim 7, wherein the flowing insulating material is a photosensitive epoxy.

* * * * *